United States Patent [19]

Baker et al.

[11] Patent Number: 4,975,883

[45] Date of Patent: Dec. 4, 1990

[54] METHOD AND APPARATUS FOR PREVENTING THE ERASURE AND PROGRAMMING OF A NONVOLATILE MEMORY

[75] Inventors: Alan E. Baker, Fair Oaks; Richard J. Durante, Citrus Heights; Owen W. Jungroth, Sonora, all of Calif.

[73] Assignee: Intel Corporation, Santa Clara, Calif.

[21] Appl. No.: 501,140

[22] Filed: Mar. 29, 1990

[51] Int. Cl.$^5$ .............................................. G11C 7/00
[52] U.S. Cl. ................................... 365/226; 365/218; 365/189.07
[58] Field of Search ................... 365/226, 218, 189.07, 365/201

[56] References Cited

U.S. PATENT DOCUMENTS

| | | | |
|---|---|---|---|
| 4,433,390 | 2/1984 | Carp ...................................... | 365/226 |
| 4,712,195 | 12/1987 | Finger .................................. | 365/226 |
| 4,777,626 | 10/1988 | Matsushita et al. .................. | 365/226 |

Primary Examiner—James W. Moffitt
Attorney, Agent, or Firm—Blakely, Sokoloff, Taylor & Zafman

[57] ABSTRACT

A circuit is disclosed for preventing the erasing and programming of a nonvolatile memory device during power up and power down transitions. A power supply generator incorporating an n-channel device and a w-channel device in a wired-or configuration is coupled to a programming voltage Vpp and to a circuit voltage Vcc, and generates a node voltage Vpwr which is the greater of Vpp-Vtn and Vcc-Vtw. Vtn is the gate threshold voltage of the n-channel device, while Vtw is the gate threshold voltage of the w-channel device. The node voltage Vpwr is coupled to a reference voltage generator which provides a reference voltage, a protecting voltage, and a biasing voltage for a Vcc comparator and a Vpp comparator. The Vcc comparator and the Vpp comparator compare Vref with the output of a Vcc divide-by-two circuit and a Vpp divide-by-five cirucit, respectively. Thus, during the power up transition of the nonvolatile memory device where over-erasing may damage the memory array, the circuit forces the nonvolatile memory device into read mode, ensuring that no damaging voltage reaches the memory array. During the power down transition of a nonvolatile memory device where over-programming may accidentally erase the content of the memory array, the circuit forces the nonvolatile memory device into read mode, ensuring that the nonvolatile memory is always in a known state, and thus one can read the memory array. As such, the use of the preferred embodiment of the present invention obviates the prior art power up and power down sequencing and also affords greater protection against accidental erasure and programming than the prior art lockout detection circuit.

23 Claims, 8 Drawing Sheets

METHOD AND APPARATUS FOR PREVENTING THE ERASURE AND PROGRAMMING OF A NONVOLATILE MEMORY

BACKGROUND OF THE INVENTION

1. Field of the Invention:

The invention relates to the field of nonvolatile memory devices and, in particular, to an apparatus and means for preventing the accidental erasure and programming of nonvolatile memory devices, and more particularly, to a circuit for protecting against the over-erasure and over-programming during a power up and power down sequence of electrically programmable and electrically erasable read-only memories (EEPROMs) and to electrically programmable read-only memories (EPROMs) having floating gates implemented in metal-oxide-semiconductor (MOS) technology.

2. Art Background:

The fabrication of nonvolatile memory devices such as electrically programmable read-only memories (EPROMs) utilizing metal-oxide-semiconductor (MOS) technology is well known in the prior art. These EPROMs employ memory cells utilizing floating gates which are generally formed from a polysilicon member completely surrounded by an insulator. Electrical charge is transferred into the floating gate using a variety of techniques such as avalanche injection, channel injection, Fowler-Nordheim tunneling, channel hot electron injection, etc. A variety of phenomena have been used to remove charge from the floating gates, including exposing the memory to ultraviolet radiation. The floating gate is programmed when the charge is stored in the floating gate. The cell is in an uprogrammed, or erase state when the floating gate is discharged.

Because of the complex and time-consuming procedures required to erase EPROMs, these devices have been used primarily in applications requiring read-only memories. Electrically programmable and electrically erasable read-only memories (EEPROMs) were developed to erase and to rewrite the memory devices on a byte-by-byte basis. These EEPROMs have also been referred to as electrically alterable read-only memory. Commercially available EEPROMs have generally used a thin oxide region to transfer the charge into and from a floating gate. In a typical memory, a two-transistor cell is used. For instance, U.S. Pat. No. 4,203,158 discloses the fabrication of such EEPROM cell. Further, U.S. Pat. No. 4,266,283 discloses the arrangement of EEPROMs into an array wherein X and Y select lines provided for the selection, programming, and reading of various EEPROM cells.

More recently, a new category of electrically erasable EPROMs has emerged and is sometimes referred to as "Flash" EPROMs or EEPROMs. In these memories, the entire array is simultaneously erased electrically. The cells themselves use only a single device per cell, and such cells are described in the pending application Ser. No. 892,446, filed Aug. 8, 1986, entitled "LOW VOLTAGE EEPROM CELL," which application is assigned to the assignee of the present invention. Flash memory devices combine the electrical erase capability of the EEPROMs with the simplicity, density and cast-effectiveness of EPROM cell layout. As such, modification of the EPROM cell replaces block UV-erasure with block electrical erasure while the device is still installed in the host system. Flash memory can also be randomly read or written. The present invention is directed towards the use of these cells as well as improvement thereon.

When a computer system to which a nonvolatile memory is coupled goes through a power up or power down transition, the system-level signals such as Vcc or Vpp are not guaranteed to be valid. Vcc is generally a 5 V supply for controlling the logic and the read mode of the nonvolatile memory device. Vpp is a 12 V supply for controlling the programming mode of the nonvolatile memory device. By power up transition, the present invention refers to the moment when the user starts the computer system. On the other hand, by power down transition, the present invention refers to the moment when the user turns off the computer system. In the past, users adhered to a power up and power down sequence in order to guarantee that the system-level signals such as Vcc and Vpp are valid. Failure to follow the power up or power down sequence exposes the nonvolatile memory devices to spurious system-level signal operations and result in data corruption or physical damage to the nonvolatile memory device. Data corruption arises because of over-programming, i.e., the application of high Vpp when the nonvolatile memory is not in a programming mode. Physical damage to the nonvolatile memory refers to another problem, specifically over-erasing. An over-erase condition arises because too much charge was removed from the floating gate, making the floating gate device "depletion-like." Unlike over-programming where the memory cells of the nonvolatile memory device is undamaged, an over-erase condition often results in permanent damage to the memory cells of the nonvolatile memory device.

The closest prior art known to applicant is a voltage lockout detector circuit disclosed in an article entitled "Control Logic and and Cell Design for a 4K NVRAM" IEEE Journal of Solid State Circuits, Volume SC-18, No. 5, October, 1983, pp. 529–530.

SUMMARY OF THE INVENTION

A circuit is disclosed for preventing the erasing and programming of a nonvolatile memory device during power up and power down transitions. A power supply generating means incorporating an n-channel device and a w-channel device in a wired-or configuration is coupled to a programming voltage Vpp and to a circuit voltage Vcc, and generates a node voltage Vpwr which is the greater of Vpp-Vtn and Vcc-Vtw. Vtn is the gate threshold voltage of the n-channel device, while Vtw is the gate threshold voltage of the w-channel device. The node voltage Vpwr is coupled to a reference voltage generator which provides a reference voltage, a protecting voltage, and a biasing voltage for a Vcc comparator and a Vpp comparator. The Vcc comparator and the Vpp comparator compare Vref with the output of a Vcc divide-by-two circuit and a Vpp divide-by-five circuit, respectively. Thus, during the power up transition of the nonvolatile memory device where over-erasing may damage the memory array, the circuit forces the nonvolatile memory device into read mode, ensuring that no damaging voltage reaches the memory array. During the power down transition of a nonvolatile memory device where over-programming may accidentally erase the content of the memory array, the circuit forces the nonvolatile memory device into read mode, ensuring that the nonvolatile memory is always in a known state, and thus one can read the memory array. As such, the use of the preferred embodiment of the present invention obviates the prior art power up and power down sequencing and also affords greater protection against accidental erasure and programming than the prior art lockout detection circuit.

DETAILED DESCRIPTION OF THE INVENTION

A circuit is disclosed for preventing the erasing and programming of a nonvolatile memory device during power up and power down transitions. In the following description, numerous specific details are set forth such as specific conductivity types in order to provide a thorough understanding of the present invention. In other instances, well known elements such as resistors, n-channel devices, p-channel devices, w-channel devices, and other well known fabrication techniques for fabricating the circuits are not described in detail in order not to unnecessarily obscure the present invention. It should be understood by one skilled in the art that a nonvolatile memory device refers to read/write memory in integrated circuit form which retains data whether or not power is applied. Furthermore, it should be understood by one skilled in the art that a nonvolatile memory device includes EPROM, EEPROM and flash memory devices.

In the preferred embodiment of the present invention, the circuit of the present invention is fabricated along with the entire memory cell on a p-type silicon substrate. Ordinary metal-oxide-semiconductor (MOS) processing is employed, and more specifically, complementary metal-oxide-semiconductor (CMOS) technology is used to fabricate the present invention, where n-type devices are formed in the substrate and p-type devices are formed in the n-wells, the n-wells being first formed in the substrate. W-channel devices are also used in the present invention. A w-channel device is an n-channel device with a gate threshold voltage of approximately 0.0 volts.

The memory cells employed in the presently preferred embodiment include floating gates which are separated from the channel regions by an oxide thickness of approximately 100°. A control gate which is fabricated from a second layer of polysilicon overlies the floating gate. The floating gate is charged by the channel injection of electrons into the floating gate and discharged by the tunneling of charge from the floating gate through the gate oxide. The details of the fabrication of the cells are described in a pending patent application, Ser. No. 892,446, filed Aug. 4, 1986, entitled "LOW VOLTAGE EEPROM CELL," which application is assigned to the assignee of the present invention.

The flash EPROM memory fabricated with the cells described above receives an externally generated erasing/programming potential Vpp of approximately 12 V and a Vcc voltage of 5 V for normal reading operations. The circuits described in FIGS. 2-7 are coupled to the Vpp voltage for putting the nonvolatile memory device into a programming mode and also coupled to the Vcc for putting the nonvolatile memory array in a read mode.

Figure 1:
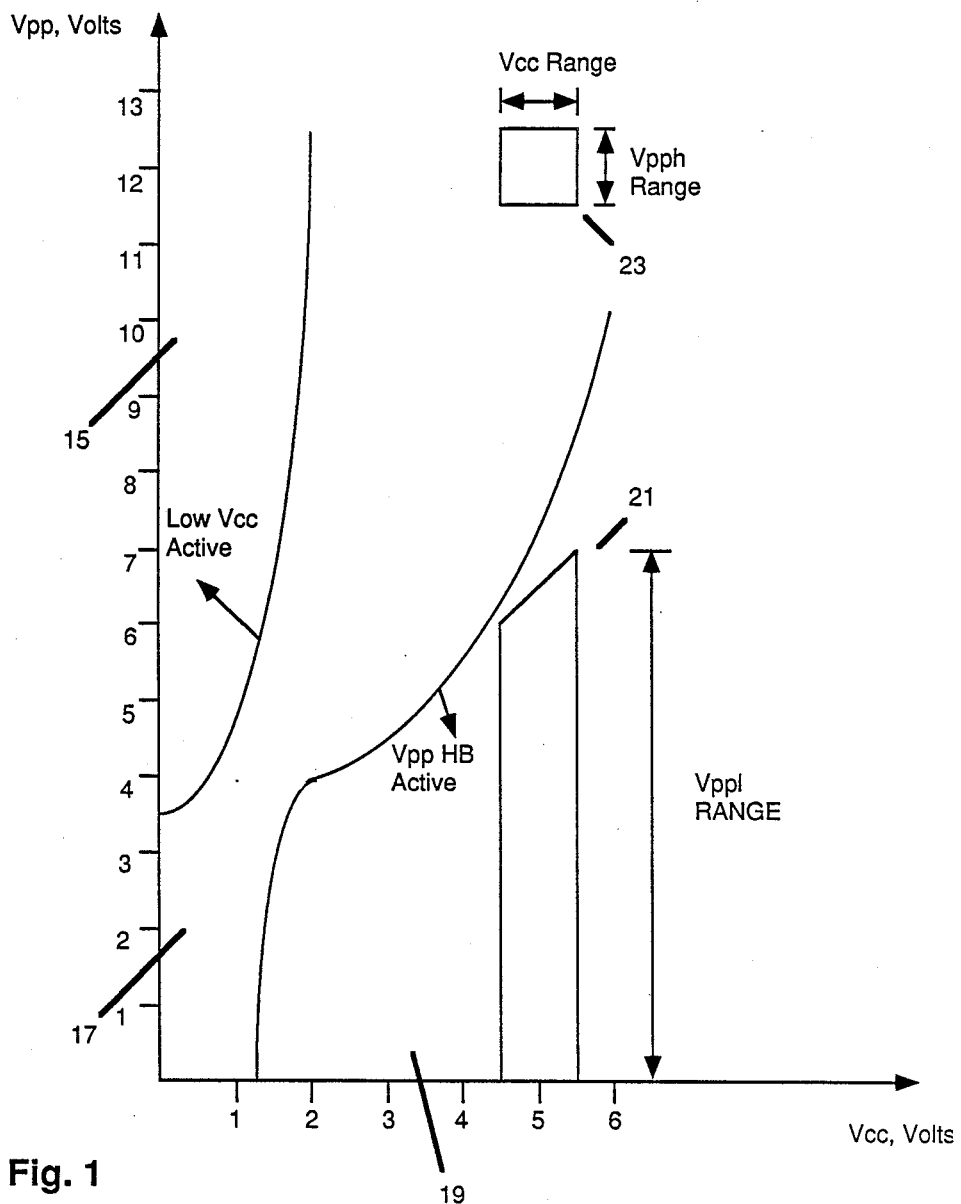
FIG. 1 is a diagram illustrating the operating range of a prior art circuit/method for protecting a nonvolatile memory device against spurious system-level signals during a power up and power down transition.

FIG. 1 is a diagram illustrating the operating range of a prior art circuit for protecting a nonvolatile memory device against spurious system signals during a power up and power down sequence. The X-axis of the diagram corresponds to the reading voltage Vcc, and the Y-axis corresponds to the programming voltage Vpp. Region low Vcc active 15 and region VppHB active 19 are regions protected by the prior art methods. By power up and power down sequencing, the present invention refers to the steps the manufacturers of memory devices recommend to end users for protecting against accidental erasure or programming of the memory device caused by spurious system-level signals that may exist during the power up and power down transitions. Referring again to FIG. 1, region 17 represents the unprotected or unknown regions of the nonvolatile memory device as it proceeds through the power up or power down transition. The unknown region 17 is in contrast to the protected or known regions 21 which corresponds to a read only state of the nonvolatile memory device, and region 23 which corresponds to the read/write region of the nonvolatile memory device. It should be understood by one skilled in the art that the state or mode of a nonvolatile memory device is set by a state machine which is also a part of the nonvolatile memory device. To avoid accidental erasure or programming of the device, power up and power down sequence is generally recommended. For instance, during the power up transition, end user is advised to wait until Vcc reaches steady state before applying Vpp. Similarly, during the power down transition, end user is advised to lower Vpp below a threshold before lowering Vcc. However, the recommended procedures are not always followed. In general, the nonvolatile memory device such as the flash EPROM is vulnerable (about 10% of the time) to accidental erasure or programming caused by spurious system level signals that may exist during power up or power down transitions. As a result, the nonvolatile memory device may experience data corruption as a result of over-programming and irreversible damages to the memory array as a result of over-erasure.

Figure 2:
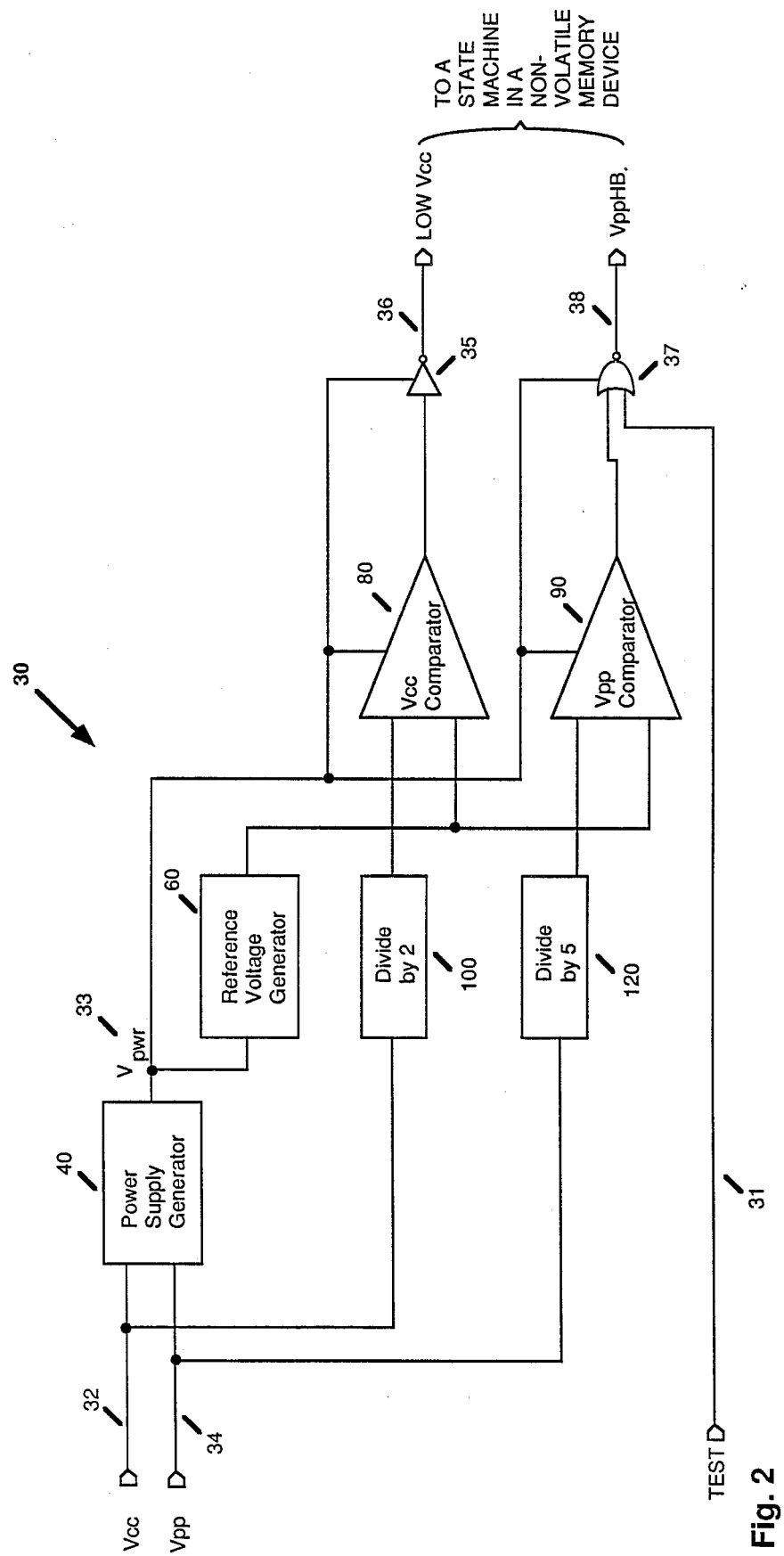
FIG. 2 is a block diagram illustrating the circuit for preventing the erasure and programming of a nonvotatile memory device used in the preferred embodiment of the present invention.

FIG. 2 is a block diagram illustrating the circuit for preventing erasure or programming used in the preferred embodiment of the present invention. The circuit 30 comprises a power supply generator 40, a reference voltage 60, a Vcc comparator 80, a Vpp comparator 90, a Vcc divide-by-two circuit 100, and a Vpp divide-by-five circuit 120. The power supply generator 40 is coupled to reading voltage Vcc 32 and programming voltage Vpp 34 for generating a node voltage Vpwr 33. The node voltage Vpwr 33 is also coupled to the reference voltage generator 60, the Vcc comparator 80, the Vpp comparator 90, the inverter 35, as well as the NOR gate 37. The reading voltage Vcc 32 is also coupled to the divide-by-two circuit 100 whose output is also coupled to the Vcc comparator 80. Similarly, programming voltage Vpp 34 is also coupled to the divide-by-five circuit 120, whose output is also coupled to the Vpp comparator 90. An optional bypass signal TEST 31 is also coupled to the NOR gate 37. The outputs of the circuit 30 are LOWVcc 36 and VppHB 38. It should be understood by one skilled in the art that circuit 30 is one of the many circuits that make up a nonvolatile memory device. It should also be understood by one skilled in the art that the output 36 and 38 of circuit 30 are coupled to a state machine in a nonvolatile memory device which is not shown. In the preferred embodiment of the present invention, the state machine of the nonvolatile memory device would either force the nonvolatile memory array into a read or read/write mode (i.e., narrowing the unprotected or unknown region in FIG. 1) in response to receiving the outputs from circuit 30.

Referring again to FIG. 2, the power supply generator 40 of the circuit 30 provides a node voltage Vpwr 33 for the circuit 30 if either Vcc or Vpp is at a high enough level. The power supply generator 40 also allows the detection of both the Vcc and Vpp levels with one circuit. In response to receiving the node voltage Vpwr 33, the reference voltage generator 60 provides the Vcc comparator 80 and Vpp comparator 90 a reference voltage of nominally 1.75 V to be compared against Vcc divided by two and Vpp divided by 5, thus giving the nominal trip points of 3.5 V and 8.75 V for Vcc and Vpp respectively. The outputs of the comparators 80 and 90 are then buffered by the inverter 35 and the NOR gate 37 to drive the output signals for the rest of the nonvolatile memory device, including the state machine and the memory array. Additionally, the VppHB output 38 of the circuit 30 can be optionally overwritten by the TEST signal 31 for other system performance operations such as aging reports.

Figure 3:
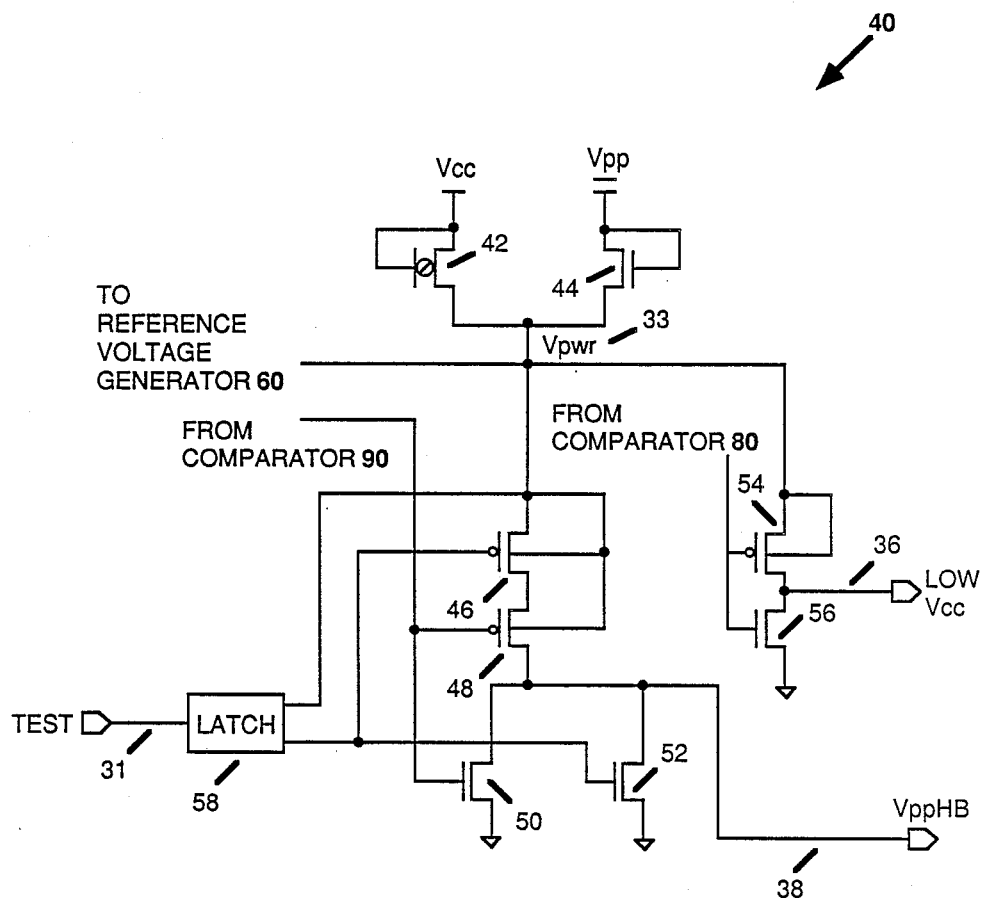
FIG. 3 is an electric schematic of the power supply generator used in the preferred embodiment of the present invention.

FIG. 3 is an electric schematic of the power supply generator used in the preferred embodiment of the present invention. The power supply generator 40 comprises n-channel devices 44, 50, 52, 56, p-channel devices 46, 48, 54, w-channel device 42 and a power latch 58. The w-channel device 42 and the n-channel device 44 are coupled in a wired-or configuration resulting in a node voltage Vpwr 33. N-channel device 44 is diode connected to the programming voltage Vpp 34. On the other hand, w-channel device 42 is coupled to the reading voltage Vcc 32. The w-channel 42 has a gate threshold voltage of Vtw, and the n-channel device 44 has a gate threshold voltage of Vtn. As such, the node voltage Vpwr 33 is the greater of either Vcc-Vtw or Vpp-Vtn. As mentioned in the preceding paragraph, the combination of w-channel device 42 and the n-channel device 44 permits the detection of both the Vcc and the Vpp levels with the same circuit. It also follows that with node voltage Vpwr 33, the power supply generator 40 provides a voltage source for the circuit 30 if either Vcc or Vpp is at a high enough level. The node voltage Vpwr 33 is also coupled to the p-channel device 54 and the n-channel device 56 for outputting the LOWVcc 36. The p-channel device 54 and the n-channel device 56 are also coupled to the Vcc comparator 80 which is not shown in FIG. 3. The node voltage Vpwr 33 is also coupled to p-channel devices 46, 48 and n-channel device 50 for outputting VppHB 38. The p-channel device 46 and the n-channel device 50 are coupled to the Vpp comparator 90 which is also not shown in FIG. 3. Node voltage Vpwr 33 is also coupled to the reference voltage generator 60 for generating a plurality of signals for comparators 80 and 90. The reference voltage generator 60 is also not shown in FIG. 3. Finally, the optional bypass signal TEST 31 is coupled to the p-channel device 46 and the n-channel device 52 over the power latch 58 for optionally overriding the output 38 of the circuit 40. The optional bypass signal 31 may be necessary for conducting system performance tests such as aging tests for the nonvolatile memory device.

Figure 4:
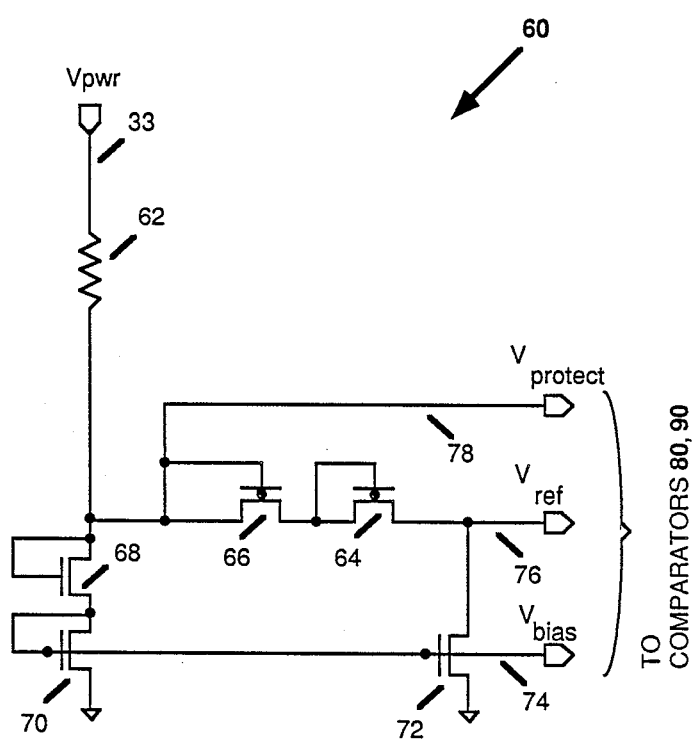
FIG. 4 is an electric schematic of the reference voltage generator used in the preferred embodiment of the present invention.

FIG. 4 is an electric schematic of the reference voltage generator used in the preferred embodiment of the present invention. The reference voltage generator 60 comprises a resistor load 62, w-channel devices 64, 66, and n-channel devices 68, 70, and 72. The resistor load 62 is coupled to the node voltage Vpwr 33. The resistor load 62 is further coupled to a pair of w-channel devices 64 and 66 and another pair of n-channel devices 68 and 70. N-channel devices 70 and 72 also form another pair from which the reference current 74 is outputted. The reference voltage 76 is outputted from the w-channel device 64 while the biasing voltage 76 is outputted from the resistor load 62. The reference voltage generator 60 is responsible for providing a reference voltage that is stable across process and temperature. As such, a delta-Vt configuration is used. The voltage at node voltage Vpwr is (Vtn+Vtn)−(Vtw+Vtw). Because the pair of w-channel devices 64 and 66 and the pair of n-channel devices 68 and 70 have similar variations in process and temperature, this configuration has the desired effect of cancelling their own process and temperature variations. The pair of n-channel devices 70 and 72 has a current mirror configuration and as such sets the reference current 74 for the comparators 80, 90.

Figure 5:
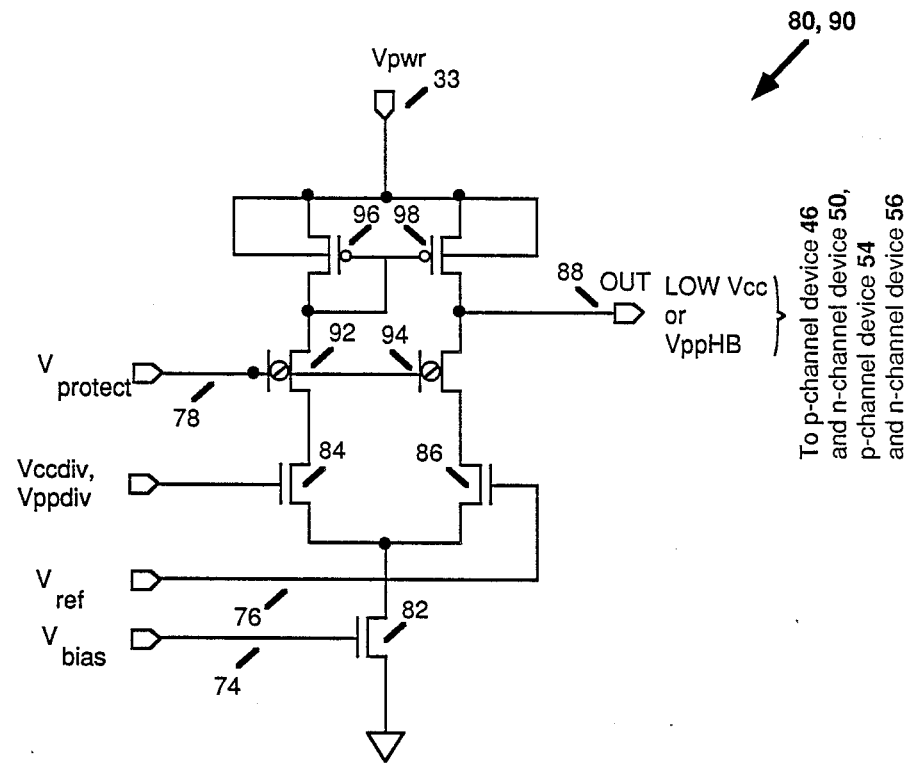
FIG. 5 is an electric schematic of the comparators used in the preferred embodiment of the present invention.

FIG. 5 is an electric schematic of the comparators used in the preferred embodiment of the present invention. Comparators 80, 90 are identical differential amplifiers and each comprises an n-channel device 82 and a pair of matching n-channel devices 84 and 86, matching pair of w-channel device 92 and 94 and matching p-channel device 96 and 98. The matching p-channel device 96 and 98 are coupled to the node voltage Vpwr 33. The matching w-channel device 92 and 94 receive the protecting voltage 78 from the reference voltage generator 60. N-channel device 84 of the matching pair and device 84 and 86 are coupled to the Vcc divide-by-two circuit 100 and the Vpp divide-by-five circuit 120. N-channel device 86 receives the reference voltage 76 from the reference voltage generator 60. Finally, n-channel device 82 receives the biasing voltage 74 from the reference voltage generator 60. The comparators 80, 90 have a single-ended output configuration in output 88. It should be understood by one skilled in the art that comparators 80, 90 are differential amplifier circuits with single-ended outputs. N-channel device 82 forms the current source for the amplifier. The matched n-channel devices 84, 86 is a differential pair. The matched w-channel pair 92, 94 provides protection for the matched n-channel pair 84, 86 against gate-aided breakdown. The matched p-channel pair 96, 98 is coupled in a current mirror configuration which is used to convert the various voltages and currents to a single-ended output 88. The single-ended output 88 is either coupled to p-channel device 54 and n-channel device 56 or to p-channel device 46 and n-channel device 50, as illustrated in FIG. 3.

Figure 6:
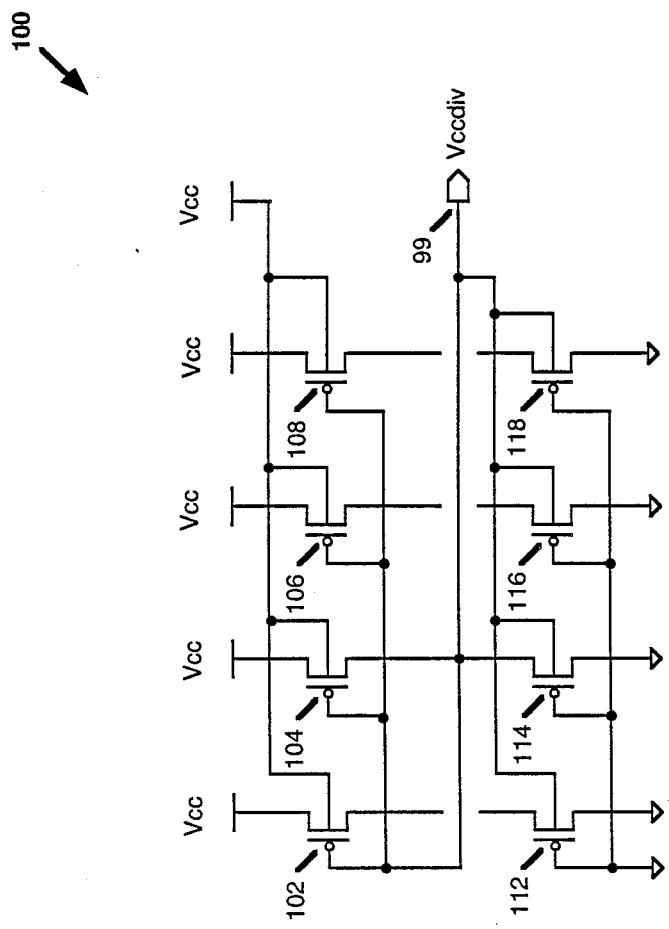
FIG. 6 is an electric schematic of the Vcc divide-by-two circuit used in the preferred embodiment of the present invention.

FIG. 6 is an electric schematic of the Vcc divide-by-two circuit used in the preferred embodiment of the present invention. The divide-by-two circuit 100 comprises p-channel devices 102, 104, 106, 108, 112, 114, 116, and 118. P-channel devices 104 and 114 comprise the nominal divide-by-two circuit, while the rest of the p-channel devices provide a degree of metal mask trimmability. The wells of the p-channel devices 102, 104, 106 and 108 are tied to the source so as to eliminate Vt discrepancies due to the body effect. The input to the divide-by-two circuit 100 is the reading voltage Vcc, and the output is Vccdiv 99 which is coupled to Vcc comparator 80. In the preferred embodiment of the present invention the p-channel pairs 102, 112, 106, 116 and 108, 118 are not tied to the output line. It should be understood by one skilled in the art that this open arrangement provides a degree of metal mask trimmability for the divide-by-two circuit 100.

Figure 7:
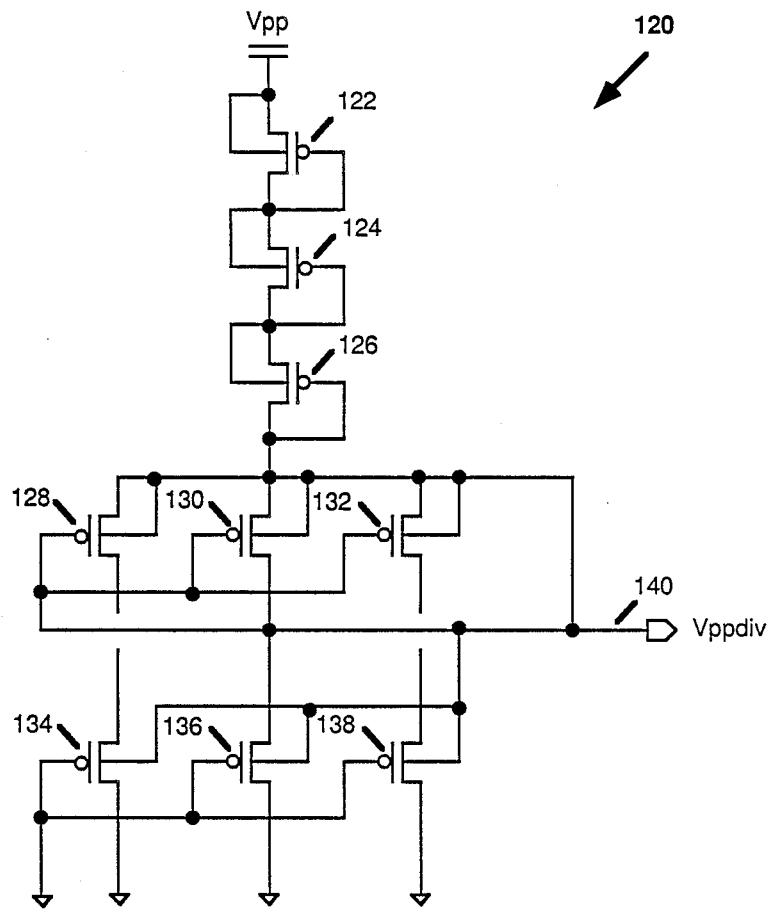
FIG. 7 is an electric schematic of the Vpp divide-by-five circuit used in the preferred embodiment of the present invention.

FIG. 7 is an electric schematic of the Vpp divide-by-five circuit used in the preferred embodiment of the present invention. The divide-by-five circuit 120 comprises p-channels 122, 124, 126, 128, 130, 132, 134, 136, and 138. P-channels 122, 124, 126, 132, and 138 are coupled in a cascading configuration to provide the nominal divide-by-five circuit, while the other p-channel devices provide a degree of metal mask option trimmability. The input to the divide-by-five circuit 120 is Vpp, and the output is Vppdiv 140 which is coupled to the Vpp comparator 90.

Figure 8:
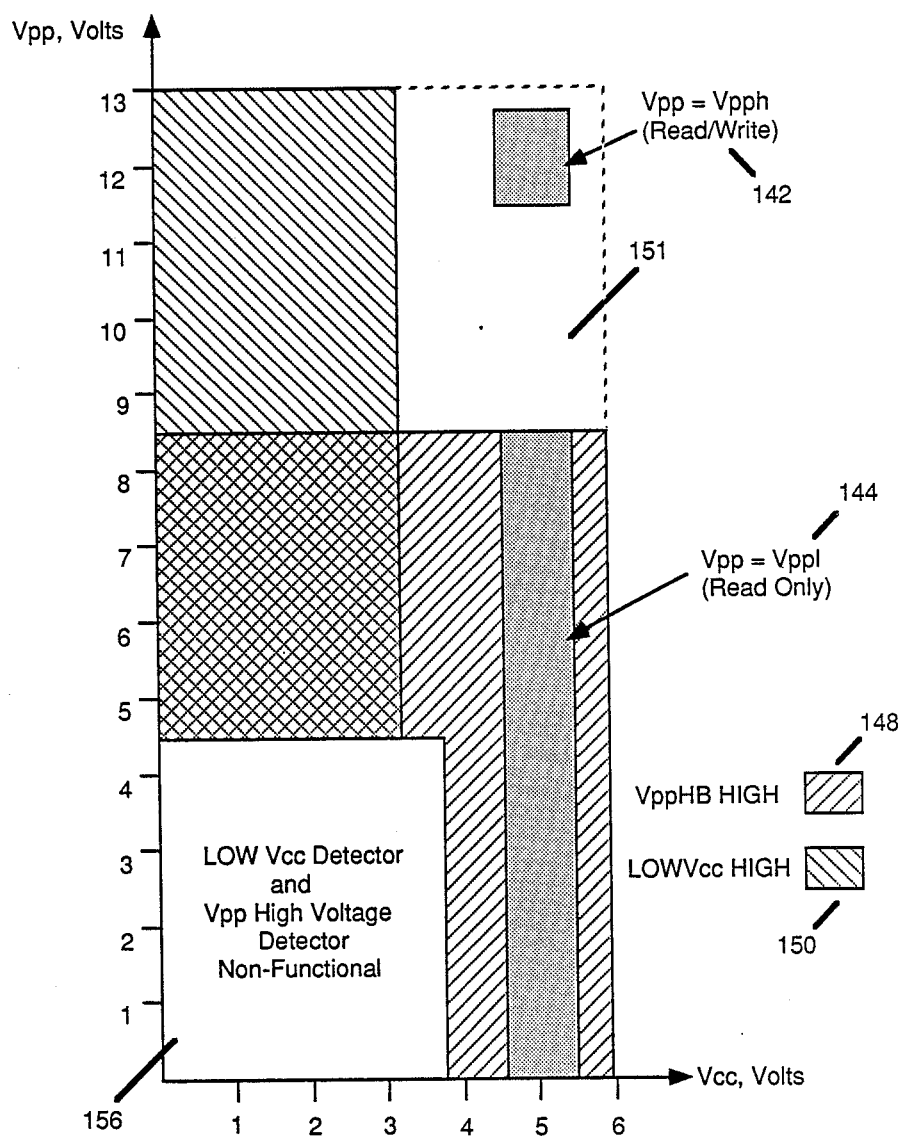
FIG. 8 is a diagram illustrating the operating range of the circuit for preventing the erasure and programming of a nonvolatile memory device used in the preferred embodiment of the present invention.

FIG. 8 is a diagram illustrating the operating range of the circuit for preventing erasure or programming used in the preferred embodiment of the present invention. Just as the diagram in FIG. 1, the X-axis of the diagram in FIG. 8 corresponds to the reading voltage Vcc and the Y-axis corresponds to the programming voltage Vpp. The diagram in FIG. 8 should be contrasted with the diagram in FIG. 1. Region 156 represents the area where both Vcc and Vpp are sufficiently low such that spurious program and over-erase cannot occur. In this region the voltages are also too low for the circuit to operate. Region 150 represents the area where LOW Vcc is active, thus protecting against spurious program and over-erase. Region 148 is the area where VppHB is active, thus protecting against spurious program and over-erase. Region 151 is the area where end user must assure that no spurious writes occur to the device. Region 142 is the valid operating range for updating the flash memory contents. As such, it is not possible to power up or power down the device without passing through the protected region designated by region 148 and region 150. By way of comparison, the unprotected region 151 as shown in FIG. 8 is substantially smaller than the unprotected region 17 as illustrated in FIG. 1. Thus, the present invention affords nonvolatile memory devices greater protection against spurious system-level signals during the power up and power down transitions.

While the present invention has been particularly described with reference to FIGS. 1-8, and with emphasis on integrated circuits, it should be understood that the figures are for illustration only and should not be taken as limitations on the invention. In addition, it is clear that the method and apparatus of the present invention have utility in many applications where protection against spurious system level signal during power up and power down transitions of a nonvolatile memory device is required. It is contemplated that many changes and modifications may be made by one of ordinary skill in the art without departing from the spirit and scope of the invention as disclosed.

We claim:

1. A circuit for preventing the erasure or programming of a nonvolatile memory device during a power up or power down transition, said circuit being coupled to a state machine of said nonvolatile memory device, said state machine providing commands to put said nonvolatile memory device in a plurality of states or nodes in response to receiving signals for said circuit, said state machine being coupled to an array of memory cells of said nonvolatile memory, said memory cells having a floating gate, said circuit comprising:

a power supply generating means coupled to a first external voltage and a second external voltage for providing a node voltage source when either said first external voltage or said second external voltage exceeds a predetermined voltage threshold;

a first dividing means coupled to said first external voltage for dividing said first external voltage by a first predetermined weight;

a second dividing means coupled to said second external voltage for dividing said second external voltage by a second predetermined weight;

a reference voltage generating means coupled to said power supply generating means for providing at least a reference voltage, a protecting voltage and a biasing voltage against which the outputs of said first dividing means and said second dividing means can be compared with said reference voltage;

a first comparing means coupled to said first dividing means and said reference voltage generating means for comparing the output from said first dividing means with said reference voltage, said first comparing means being further coupled to said power supply generating means for receiving said voltage source, said first comparing means being coupled to said state machine of said nonvolatile memory device for providing a first lockout voltage when the output from said first dividing means exceeds said reference voltage, a second comparing means coupled to said second dividing means and said reference voltage generating means for comparing the output from said second dividing means with said reference voltage, said second comparing means being further coupled to said power supply generating means for receiving said node voltage source, said second comparing means being coupled to said state machine of said nonvolatile memory device for providing a second lockout voltage when said reference voltage exceeds the output from said second dividing means.

2. The circuit as defined in claim 1, wherein said power supply generating means comprises at least one n-channel device and at least one w-channel device being coupled in a wired-or node, said n-channel device being diode-connected to said first external voltage, said n-channel device having an n-channel device having an n-channel gate threshold voltage, said w-channel device being coupled to said second external voltage, said w-channel device having a w-channel gate threshold voltage.

3. The circuit as defined in claim 1, wherein said predetermined voltage threshold comprises the difference between said first external voltage and said n-channel gate threshold voltage.

4. The circuit as defined in claim 1, wherein said predetermined voltage threshold comprises the difference between said second external voltage and said w-channel gate threshold voltage.

5. The power supply generating means defined in claim 2, wherein said wired-or node is coupled to a p-channel device, said p-channel device being further coupled to an n-channel device for generating said first lockout voltage.

6. The power supply generating means defined in claim 2, wherein said wired-or node is coupled to a p-channel device, said p-channel device being further coupled to an n-channel device for generating said second lockout voltage.

7. The power supply generating means defined in claim 2, wherein said wired-or node is coupled to said reference voltage generating means providing thereto said node voltage source, said node voltage source being higher than said predetermined voltage threshold.

8. The p-channel device and the n-channel device defined in claim 5 are further coupled to said first comparing means.

9. The p-channel device and the n-channel device defined in claim 6 are further coupled to said second comparing means.

10. The power supply generating means defined in claim 5, wherein said first lockout voltage is said node voltage source if the output from said first comparing means exceeds the node voltage source.

11. The power supply generating means defined in claim 5, wherein said first lockout voltage is the voltage of the output of said first comparing means if said node voltage source exceeds the output from said first comparing means.

12. The power supply generating means defined in claim 6, wherein said second lockout voltage is the output of the second comparing means if the output from said second comparing means exceeds said node voltage source.

13. The power supply generating means defined in claim 6, wherein said second lockout voltage is said node voltage source if the said node voltage source exceeds the output from said second comparing means.

14. The circuit as defined in claim 1, wherein said reference voltage generating means comprises a resistor load, a plurality of w-channel devices, and a plurality of n-channel devices, said resistor load being coupled to said wired-or node of said power supply generating means, said resistor load being further coupled to said w-channel devices, said resistor load being coupled to said n-channel devices.

15. The reference voltage generating means defined in claim 14, wherein said resistor load further provides said protecting voltage to said first comparing means and to said second comparing means.

16. The reference voltage generating means defined in claim 14, wherein said w-channel device provides said reference voltage to said first comparing means and to said second comparing means.

17. The reference voltage generating means defined in claim 14, wherein said n-channel devices provide said biasing voltage to said first comparing means and to said second comparing means.

18. The circuit as defined in claim 1, wherein said first dividing means comprises a plurality of p-channel devices in cascading configuration, said one p-channel device being coupled to said first external voltage, said p-channel devices further providing a voltage having said first external voltage divider by said first predetermined weight.

19. The first dividing means defined in claim 18, wherein said first predetermined weight is five.

20. The circuit as defined in claim 1, wherein said second dividing means comprises a plurality of p-channel devices in cascading configuration, said one p-channel device being coupled to said second external voltage, said p-channel devices further providing a voltage having said second external voltage divided by said predetermined weight.

21. The second dividing means defined in claim 20, wherein said second predetermined weight is two.

22. The circuit as defined in claim 1, wherein said first comparing means and said second comparing means each comprises at least an n-channel device, at least a pair of n-channel devices, at least a pair of w-channel devices and at least a pair of p-channel devices, said first comparing means and said second comparing means each having a single-ended output configuration.

23. The comparing means defined in claim 22, wherein said n-channel device is coupled to said biasing voltage for providing current source for said comparing means, said n-channel device being further coupled to said pair of n-channel device being further coupled to said pair of n-channel devices, said pair of n-channel devices being matched, said pair of n-channel devices being coupled to said reference voltage generating means to said first dividing means and to said second dividing means for amplifying the difference voltage thereof, said pair of n-channel devices being further coupled to said pair of w-channel devices, said pair of w-channel devices being coupled to said reference voltage generating means for minimizing gate added breakdown of said pair of n-channel devices, said pair of w-channel devices being further coupled to said pair of p-channel devices, said pair of p-channel devices being further coupled to p-channel devices for providing biasing current for said comparing means, said pair of p-channel devices being coupled to said wired-or node of said power supply generating means.

* * * * *